United States Patent
Schmidt (10) Patent No.: US 7,964,784 B2
(45) Date of Patent: Jun. 21, 2011

(54) THERMOGENERATOR

(75) Inventor: Frank Schmidt, Altkirchen (DE)

(73) Assignee: Enocean GmbH, Oberhaching (DE)

( * ) Notice: Subject to any disclaimer, the term of this patent is extended or adjusted under 35 U.S.C. 154(b) by 526 days.

(21) Appl. No.: 11/805,229

(22) Filed: May 21, 2007

(65) Prior Publication Data

US 2007/0272293 A1    Nov. 29, 2007

(30) Foreign Application Priority Data

May 23, 2006 (DE) .......................... 10 2006 024 167

(51) Int. Cl.
*H01L 35/00* (2006.01)

(52) U.S. Cl. ....................................... 136/205

(58) Field of Classification Search ........... 136/200–242
See application file for complete search history.

(56) References Cited

U.S. PATENT DOCUMENTS

| | | | |
|---|---|---|---|
| 4,165,477 A | 8/1979 | Comte | |
| 4,245,286 A | 1/1981 | Paulkovich et al. | |
| 5,705,770 A | 1/1998 | Ogasawara et al. | |
| 5,769,622 A | 6/1998 | Aoki et al. | |
| 6,122,185 A | 9/2000 | Utsunomiya et al. | |
| 6,232,543 B1 | 5/2001 | Nagata | |

FOREIGN PATENT DOCUMENTS

| | | |
|---|---|---|
| DE | 698 19 431 T2 | 8/2004 |
| EP | 0 898355 | 2/1999 |
| EP | 0 919 887 | 6/1999 |
| EP | 0 935 334 | 8/1999 |
| GB | 2 017 359 A | 3/1979 |
| WO | WO 00/17997 | 3/2000 |
| WO | WO 01/91315 | 11/2001 |
| WO | WO 02/095707 A1 | 11/2002 |

OTHER PUBLICATIONS

Damaschke, Design of a low-input-voltage converter for thermoelectric generator, IEE Transactions on Industry Applications, vol. 33, No. 5, Oct. 1997, pp. 1203-1207.*
Amirtharajah R et al., "Self-Powered Signal Processing Using Vibration-Based Power Generation", IEEE Journal of Solid-State Circuits, IEEE Service Center, vol. 33, No. 5, May 1998, pp. 687-695.

* cited by examiner

*Primary Examiner* — Jessica L Ward
*Assistant Examiner* — Kevin E Yoon
(74) *Attorney, Agent, or Firm* — Foley & Lardner LLP (57) ABSTRACT

A thermogenerator with a first electrical voltage source (20) having a first voltage output (30) and a second electric voltage source (40) having a second voltage output (50). The first electrical voltage source (20) is formed of a first thermoelectric element (25), and a third voltage output (60) is provided, coupled to the first voltage output (30) and the second voltage output (50). A method is disclosed for the conversion of thermal energy into electrical energy, in which electrical voltage is generated by a first thermoelectric element (25), and where voltage is generated at least some of the time by means of a second voltage source (40), and where, by means of a converter circuit (150), the electric voltage from the first thermoelectric element (25) is converted to a higher voltage level.

7 Claims, 5 Drawing Sheets

THERMOGENERATOR

RELATED APPLICATION

This patent application claims the priority of the German patent application no. 10 2006 024 167.3 filed May 23, 2006, the disclosure content of which is hereby explicitly incorporated by reference.

FIELD OF THE INVENTION

The invention concerns a thermogenerator and method for converting thermal energy into electrical energy.

BACKGROUND OF THE INVENTION

Converting thermal energy into electrical energy is, in general, a process that has long been familiar. The large number of power stations generating electrical energy might be mentioned as an example. Converting thermal energy into kinetic energy is a fundamental part of this process. The kinetic energy is converted, in turn, into electrical energy. In order to run this process and to generate worthwhile quantities of electrical energy in this way, a large quantity of thermal energy is necessary, characterized by a high temperature difference of several hundred degrees Celsius between the materials or objects having the thermal energy and the ambient temperature. Thermal energy at a lower temperature cannot be converted into electrical energy through the processes mentioned above. Thermoelectric processes are known that convert thermal energy at lower temperature levels into electrical energy. It is a feature of thermoelectric processes of this type that they are only able to generate very low voltages or only very small electric currents.

For this reason thermoelectric processes are exploited in instrumentation engineering, where the electrical voltages that are generated and that are, due to the nature of the effects on which they are based, very small, are used as references to a specific temperature or temperature difference. Thermoelectric processes of this type have therefore until now only been used for measuring temperature.

A disadvantage is that in the past it has not been possible to operate electrical equipment, including semiconductor-based electrical equipment, using the power from converters based on thermoelectric effects. This is because the electrical voltages or electrical currents, as mentioned above, are too small.

Until now, no practical and simple solution has been known for the conversion of thermal energy at low temperatures into electrical energy that can in turn be supplied for further use in electrical equipment, rather than merely being used for temperature measurement. Thermal energy at low temperature levels is not used for power conversion as such. This is also due particularly to the fact that thermal energy at low temperature levels is not reliably available in adequate quantities when the electrical power is needed. Thermal energy in the form of waste heat from machines or similar devices may be mentioned as an example of this.

SUMMARY OF THE INVENTION

One object of the invention is to make thermal energy at low temperature levels, or embodied in small temperature differences from the surroundings, usable for the operation of electrical equipment.

This and other objects are attained in accordance with one aspect of the invention directed to a thermogenerator having a first electrical voltage source with a first voltage output and a second electrical voltage source with a second voltage output. The first electrical voltage source includes a first thermoelectric element. A third voltage output is provided, coupled to the first voltage output and the second voltage output.

A second aspect of the invention is directed to a method for converting thermal energy into electrical energy is proposed, in which electrical voltage is generated by a first thermoelectric element, and in which electrical voltage is, at least some of the time, available from a second voltage source. The electrical voltage from the first thermoelectric element is converted to a higher voltage by means of a converter circuit.

To prevent the two voltage sources from feeding power to each other, a decoupling arrangement is provided on at least the thermoelectric voltage source. A decoupling arrangement of this sort can, for instance, consist of a diode.

Thermoelectric components can be used as the thermal element to construct the first voltage source, operating on the basis of a thermoelectric process.

The Seebeck effect is an example of a thermoelectric process. The Seebeck effect is the name given to an electrical current, known as the thermal current, that flows if a closed electrical circuit has two soldered joints between different materials at different temperatures. This thermal current can be measured at temperature differences of 1 kelvin and less.

The thermal voltage created by the Seebeck effect depends on the metals, or pairs of metals, used. The Seebeck effect is the principle on which thermocouples operate, where electrical voltage is generated in response to a temperature. The voltages generated in this way are very small, and can only be directly used to operate further electrical circuits if the power and voltage requirements of the driven circuits are also very small.

The second voltage source can be used favorably to compensate for variations in the voltage or failures in the supply resulting from changing temperatures. In this way it becomes possible to operate the electrical device continuously.

The voltage generated thermally by a single thermocouple is very small. In order to increase the generated voltage, it is possible to operate thermocouples in series. This allows higher output voltages to be achieved. Because each individual thermocouple has its own internal resistance, connecting the thermocouples in series also increases the total internal resistance of the thermocouples. A higher output voltage can therefore be achieved, but this reduces the efficiency of the first voltage source. Depending on the electrical device connected, it is possible that the higher voltage is of more importance to operation of the device than the efficiency of the voltage source from which the device draws the electrical power that it needs.

On the other hand, however, by operating thermocouples in parallel, or by designing the thermocouples to have a larger area, a higher current is generated instead of a higher voltage. The thermocouples generate a greater thermal current in that case. The parallel connection improves the internal resistance favorably, as the internal resistance of the total circuit is favorably reduced. Depending on what electrical device is connected, the higher current may here be more important to operation of the device.

The Peltier effect is another thermoelectric effect. It is used in the Peltier elements of the same name. A Peltier element consists of two thin ceramic plates, between which a large number of small, rectangular pieces of semiconductor material are soldered, alternating between p-type and n-type. Each two different rectangles are joined in such a way that they create a series circuit. The electrical current supplied flows through all the rectangles in sequence. Depending on the strength and direction of the current, one plate cools down while the other heats up. The current therefore generates a temperature difference between the plates. The Peltier effect is also reversible. If one side of the Peltier element is cooled down by applying a heat sink to it, a temperature difference develops between the two sides of the Peltier element, as a result of which electrical current can be generated. Like the thermocouples operating according to the Seebeck effect, the electrical voltage obtained in this way is very small.

The pyroelectric effect is another thermoelectric effect. This results from a temperature dependency in what is known as spontaneous polarization. The term spontaneous polarization refers to electrical polarization found in a crystal without there being any external influences causing that polarization. A temperature change of 1 kelvin causes a change in the electrical field created by the spontaneous polarization of up to 105 V/m. Only a small number of crystals with a specific structure demonstrate the pyroelectric effect.

In a favorable embodiment, the second source of electrical voltage is formed from a first electrical storage element. Either a primary-cell battery or accumulator could be chosen as an appropriate method of storing electrical energy. A primary-cell battery has the advantage of being economical to acquire, but can mean that the operating costs develop unfavorably when the powered electrical equipment has a relatively high demand for current. It follows that a primary-cell battery is advantageous if the electrical equipment that is to be powered by the thermogenerator has a very low requirement for energy or current. For electrical equipment that requires larger currents, it is advantageous to use an accumulator. This stores the electrical energy obtained from the thermal energy, and supplies it to the powered equipment. Alternatively, a capacitative electrical component can be used as a store of electrical energy. This has a practically unlimited service life; it is not subject to ageing in the way that electrochemical stores are. In this way the electrical equipment can be supplied by two voltage sources working in parallel. The powered equipment does not operate constantly, and may also adopt different operating conditions involving different power requirements. In the same way, the quantity of electrical energy generated by the thermoelectric process does depend on the quantity of thermal energy. Only in ideal cases does the consumption of electrical energy coincide with the generation of electrical energy. It is therefore particularly advantageous for the accumulator to store surplus electrical energy so that it can then be supplied to the powered equipment when the quantity of electrical energy being converted from thermal energy is not sufficient to operate the powered equipment.

In a favorable embodiment of the thermogenerator the second source of electrical voltage consists of a Wiegand or pulse-wire element.

A Wiegand or pulse-wire element is a component responsive to magnetic fields, converting a change in a magnetic field into an electrical signal, i.e. magnetic energy into electrical energy. The conversion of magnetic energy into electrical energy by a Wiegand or pulse-wire element relies on shape or magneto-crystalline anisotropy, so that only a single magnetic domain can form. The hysteresis curves of Wiegand or pulse-wire elements are almost rectangular. The remanence of Wiegand or pulse-wire elements is only insignificantly smaller than their saturation magnetization. When an external magnetic field exceeds the coercivity of the Wiegand or pulse-wire element, the magnetization inverts spontaneously, adopting the opposite direction with the same magnitude. If the magnetic material is located within an induction coil, a significant voltage will be induced in it, as the saturation magnetization is very large, leading to a change in the saturation flux density within a short period of time. As a result of these properties, Wiegand and pulse-wire sensors can indicate a change in external magnetic fields digitally, or can convert a change in an external magnetic field into electrical energy. Wiegand or pulse-wire sensors are constructed from wires that have shape anisotropy as a result of a long, drawn structure. The shape anisotropy can be reinforced by applying tension. Wiegand or pulse-wire sensors therefore represent a source of voltage, and operate without movement or contact over a temperature range from approx. −200° C. up to +200° C.

Voltage pulses are generated in the coil that is wound around a Wiegand or pulse-wire element, and these can be transmitted without difficulty or interference over long distances. The advantages of Wiegand and pulse-wire elements are the ability to use the output signal developed in the elements directly without additional amplification, a large measure of independency from the ambient temperature and an absence of dependency on the rate at which the magnetic field changes.

In the favorable embodiment using the Wiegand or pulse-wire element, it is coupled with the first voltage source in such a way that the voltage from the first voltage source is applied to a coil. In the coil a magnetic field generated by the coil changes as a result of the change in voltage. As the voltage rises, so does the current through the coil and therefore also the magnetic flux of the generated magnetic field. If the magnetic flux rises until it exceeds the coercivity, the magnetization of the Wiegand or pulse-wire element spontaneously inverts, creating a high electrical voltage in a coil of the Wiegand or pulse-wire element. Alternatively, a soft iron core is used to couple the magnetic field of the coil optimally with the Wiegand or pulse-wire element. The high electrical voltage generated by the Wiegand or pulse-wire element is supplied to the first storage element or to the powered equipment.

In a favorable embodiment of the thermogenerator the second source of electrical voltage consists of a semiconductor voltage multiplier. The semiconductor voltage multiplier is coupled to the first voltage source in such a way that a voltage input to the semiconductor voltage multiplier is coupled to the voltage output of the first voltage source. The semiconductor voltage multiplier is an oscillator, whose oscillation starts at even very low voltages. A transistor having a low threshold voltage, such as a germanium transistor, is used. This is coupled in such a way to a primary winding of a transformer that the transistor is initially conducting, causing a magnetic field to develop in the primary winding. An opposing voltage is therefore induced in a secondary winding of the transformer, causing the transistor to turn off. At this moment the magnetic field in the primary winding collapses, and the procedure begins again. In this way it is possible to multiply the input voltage. The higher electric voltage that results is passed to the first storage element or to the powered equipment.

In an alternative embodiment of the thermogenerator, the second electrical voltage source consists of a second thermoelectric element. This allows the differing properties of thermoelectric elements to be combined favorably. It is possible, for instance, to combine a Peltier element with a pyroelectric element. In this way, not only is a spatial temperature gradient in a suitable body thermally converted to electrical energy, but thermal energy is also converted to electrical energy as the temperature of the body changes over time.

In a further alternative embodiment, the second electrical voltage source is formed of a combination of, for instance, the parallel connection of a second thermoelectric element with the first electrical storage element. In this way, the advantages mentioned above are extended by the advantage of storing surplus electrical energy. In this way, the combination of the first thermoelectric element with the second thermoelectric element and the first storage element forms a thermogenerator that favorably combines various thermoelectric processes and their properties and which, moreover, stores the surplus electrical energy, not required by the powered equipment, in the first electrical storage element. The storage means that the electrical energy can still be supplied to the powered equipment when no thermal energy is available for conversion into electrical energy.

In a further favorable embodiment it is proposed to extend one of the alternative embodiments mentioned above favorably through the connection of a second electrical storage element with the voltage output of the thermal generator. Either a primary-cell battery or accumulator could here again be chosen as an appropriate method of storing electrical energy. A primary-cell battery has here again the advantage of being economical to acquire, but can here again mean that the operating costs develop unfavorably if the powered equipment has a relatively high demand for current. It follows that a primary-cell battery is in this case particularly advantageous if the electrical equipment that is to be powered by the thermogenerator has a very low requirement for energy or current. For electrical equipment that requires larger currents, it is here again advantageous to use an accumulator. This stores the electrical energy obtained from the thermal energy, and supplies it to the powered equipment. Alternatively, a capacitative electrical component can be used here as a store of electrical energy. This has a practically unlimited service life; unlike electrochemical stores, it is not subject to an ageing process. The second electrical storage element is particularly advantageous to the alternative embodiment that has two thermoelectric elements but does not have an electrical energy store. The powered equipment can then be supplied from various voltage sources, as a result of which a supply of electrical energy can be provided for the powered equipment when the thermogenerator, and therefore also the thermal energy source, is in various operating conditions. The powered equipment does not operate constantly, and may also adopt varying operating conditions involving different power requirements. All the same, the quantity of electrical energy generated by the thermoelectric process does depend on the quantity of thermal energy. Only in ideal cases does the consumption of electrical energy coincide with the generation of electrical energy. It is therefore particularly advantageous for the accumulator to store surplus electrical energy so that it can then be supplied to the powered equipment when the quantity of electrical energy being converted from thermal energy is not sufficient to operate the powered equipment.

It is favorable to form the first electrical voltage source from a thermoelectric element that is responsive to spatial temperature gradients. It is, further, favorable for the second thermoelectric element, or the second voltage source, to be formed from an element that responds to temperature changes. These elements can be coupled thermally to the body. The thermal coupling between the body and the thermoelectric elements can be implemented in a variety of ways. One evident example is provided by thermal coupling using a thermally conductive paste applied between the body and the thermoelectric element, coupling them thermally to the body. It is also possible to create the thermal coupling by means of what are known as heatpipes, using, for instance, a medium that transfers heat and a pipe in which that medium flows. The use of a thermally conductive paste assumes that the thermogenerator is positioned on or even attached to the body in a suitable way.

If a thermocouple that is responsive to spatial temperature gradients and that, as a result of the spatial temperature gradient, converts thermal energy into electrical energy is used as the first voltage source, it is favorable to increase the spatial temperature gradient by means of a heat sink. In that case the heat sink should be located on the side or surface of the thermal element that is opposite to the body.

It is also advantageous to provide a voltage converter that has a first voltage input that is connected to the first voltage output, and has a second voltage input that is connected to the second voltage output. The voltage converter is then designed to deliver a voltage that is different from the first voltage input at its third voltage output. In this way it is possible to arrange that voltage levels that are lower than the level required by the powered equipment can be raised to a higher level. Equally, voltages that are greater than the level required by the powered equipment can be converted to a lower level. It is therefore possible to produce an electrical voltage suitable for the powered equipment, independently of the voltage delivered by the thermocouple.

A favorable embodiment includes a conversion circuit that converts the voltage level of the first voltage input to a higher voltage level at an output of the converter circuit. A current limiting circuit is, moreover, provided, inserted between the output of the converter circuit and the third voltage output. The current limiting circuit here limits the output current of the thermogenerator to a preset value. This value is selected in such a way that the voltage converter is not overloaded by the current drawn by the powered equipment. It is furthermore advantageous if the current limiting equipment can be controlled in dependency on the input signal at the first voltage input of the voltage converter. In this way it is, on the one hand, possible to avoid the situation in which the voltage converter can no longer operate due to the excessive amount of current being drawn. On the other hand it is possible in this way to arrange that the current drawn is not limited to a degree that is greater than necessary.

It is favorable to implement the converter circuit as a semiconductor circuit in the form of a switching converter. Semiconductor switching converters are more efficient than electromechanical converter circuits. The higher efficiency is of great importance, particularly in the light of the low electrical voltages or electrical currents that are expected, as the least possible electrical energy should be consumed by the process of voltage conversion.

Converter circuits that are implemented in semiconductor form require a minimum voltage of around 0.3 V in order to initiate the process of voltage conversion. This minimum voltage, referred to below as the threshold voltage, is provided in a favorable embodiment by a starting unit. This starting unit is connected to the second voltage input of the voltage converter, and converts the voltage signal from the second voltage input into a start signal. The second voltage input of the voltage converter is, as described above, connected to the second voltage source, and this is implemented as a pyroelectric element. If the temperature of the body changes, the pyroelectric element generates a voltage signal greater than 1 volt. This voltage signal is supplied to the starting unit, where it is converted into the start signal. The start signal is passed to the converter circuit, the voltage of the start signal being greater than the threshold voltage of the semiconductor circuit. The electric voltages that are generated by pyroelectric elements are very high, and can be much more than 1 volt. In order to avoid damaging the semiconductor elements in the converter circuit by very high voltages, the starting unit is designed in such a way that the voltage level of the start signal can be limited to the necessary threshold voltage.

If the temperature of the body does not change, but if a spatial temperature gradient is nevertheless present that permits the conversion of thermal energy into electrical energy, the electrical voltage generated by the Peltier element is not in itself sufficient to exceed the threshold voltage, as the voltage level of a Peltier element is less than the threshold voltage. In order, however, to convert the electrical voltage from the Peltier element to a higher level even when the thermogenerator is in such an operating state, it is favorable therefore to provide a clock, by means of which a signal can be provided repeatedly to the starting unit, in response to which a start signal is issued. It is furthermore favorable here if the clock is connected to the first and/or second electrical storage element, whose stored charge can be used to supply a signal to the starting unit.

A thermogenerator is thereby proposed having a first thermoelectric element responsive to a spatial temperature gradient and a second thermoelectric element responsive to changes in temperature. The two thermoelectric elements can both be coupled to one body. The first thermoelectric element that is responsive to the temperature gradient has a first voltage output, and this is connected to a first voltage converter input of a voltage converter. In addition, the second thermoelectric element that responds to changes in temperature has a second voltage output connected to a second voltage converter input of the voltage converter. Electrically powered equipment can be connected to the third voltage output. The voltage converter here converts the voltage at the first voltage converter input to a different level, higher than that of the first voltage converter input, and this is present at the voltage converter output, and thereby at the third voltage output.

It is favorable to implement the second thermoelectric element, responsive to changes in temperature, as a pyroelectric element, and to implement the first thermoelectric element, responsive to temperature gradients, as a Peltier element. The pyroelectric element here exploits the property of pyroelectric crystals or pyroelectric ceramics, and is therefore manufactured in the form of such a crystal or such a ceramic material, where the crystal or the ceramic generates an electrical field as a reaction to temperature changes. This pyroelectric effect generates voltages that are much larger than 1 V, and are therefore also suitable for overcoming the threshold voltage of a semiconductor-based converter circuit.

In order not to damage the semiconductor circuit by excessive voltages generated by the pyroelectric element, a device is provided at the second voltage input of the voltage converter or at the second voltage output of the second thermoelectric element, limiting the voltage to a prespecified maximum level.

Heat energy is passed through the thermal coupling to the thermoelectric element, and this generates an electric voltage depending on the heat energy. By means of the voltage converter, the electrical voltage generated by the first thermoelectric element, in reaction to spatial temperature gradients, is converted to a level higher than that voltage.

By means of the pyroelectric element, or of the second thermoelectric element that responds to changes in temperature, the threshold voltage of the semiconductor-based voltage converter is now overcome. The semiconductor-based converter circuit converts the voltage signal generated in response to the temperature gradients to a higher level.

A combustion engine provides an example of a body whose heat, or waste heat, could be used for conversion from thermal energy into electrical energy. When the engine is being started, it is cold, and can be considered still to be cold during the following seconds. As the period of operation extends, the engine heats up continuously until it has reached a more or less constant temperature. During the period in which the engine is heating up, the voltage generated by the first thermoelectric element, responsive to changes in temperature, overcomes the threshold voltage in the converter circuit. When a temperature is reached that is higher than the temperature of the surroundings, the temperature gradient is converted into an electrical voltage by means of the second thermoelectric element that responds to spatial temperature gradients, and this is passed to the converter input.

The starting unit is connected to the second voltage converter output and to the converter circuit; the converter circuit is activated by signals originating in the starting unit. If, for instance, a high voltage input signal is present at the second voltage input of the voltage converter, the energy required to overcome the threshold voltage and to start operation of the converter circuit is drawn from this input. If, however, sufficient energy is not available in the form of electrical voltage at this input, a clock is used to send signals repeatedly, or at periodic intervals, to the starting unit; the unit is able to overcome the threshold voltage of the voltage converter circuit with the energy contained in this signal, so forming a start signal for the converter circuit. The start signal not only contains the information for starting the converter circuit, but also sufficient energy to operate the converter circuit briefly. The start signal is asserted for long enough for the converter circuit to be adequately powered by the energy from the first voltage source.

The clock obtains its energy from the first or second storage facility where the electrical energy that will start the converter circuit is stored. This storage facility is a charge store that can be implemented as a capacitative element or as an electrochemical charge store.

A DC converter in the form of an up-converter serves as the converter circuit, converting a voltage input signal to a higher voltage level. This is done by interrupting the current flowing through a coil at periodic intervals, so generating a higher voltage signal in the coil than the input signal at the voltage converter. As a result of being implemented as a semiconductor circuit, this interruption of the current flow is carried out by semiconductor components, transistors for instance, and these do not switch below the threshold value of approximately 0.3 V.

A method is further proposed for fulfilling the task in which, for the purposes of converting thermal energy into electrical energy by means of a first thermoelectric element, electric voltage is generated and where, by means of a second voltage source, electrical voltage is present that can then be supplied to powered equipment if the voltage of the first thermoelectric element falls below a pre-specified value. In this way it is favorably ensured that under two significantly different operating conditions of the heat source, electrical energy is available to the powered equipment when its operating circumstances require it. The two significantly different operating conditions of the heat source are, for instance, the presence of a temperature level in the heat source that is higher than that of the surroundings or, on the other hand, the absence of a temperature difference between the heat source and the surroundings. If, as a result of the absence of thermal energy, it is not possible to convert any into electrical energy, the electrical energy for the operation of the powered equipment is taken from the second voltage source. The second voltage source in this case can be an electrical storage element that provides intermediate storage for electrical energy.

In one favorable embodiment of the method, the electrical voltage from the second voltage source is created by a magneto-electric process in a material with shape anisotropy. Materials with shape anisotropy have the property of having only one magnetic domain. The effect of this is that when an external magnetic field acting on the material with shape anisotropy exceeds a certain value, this magnetic domain spontaneously inverts, so generating a high voltage in a coil surrounding the material that has shape anisotropy. The shape-anisotropic material therefore acts, in combination with the coil that surrounds it, as a source of voltage.

In a favorable embodiment of the method, the electrical voltage from the second voltage source is created by a thermoelectric process. This means that the supply of the powered equipment with electrical energy can be adapted favorably to the source of heat.

It is, further, favorable if the thermoelectric process is based on a pyroelectric effect. By means of a pyroelectric process, not only may an absolute temperature or a temperature gradient be converted into electrical energy, as is the case with thermocouples, but even a change in temperature can be converted into electrical energy.

In a further favorable embodiment of the method, the electrical voltage from the first thermoelectric element is converted to a higher voltage level by means of a converter circuit. In this way it is possible to arrange that voltage levels that are lower than the level required by the powered equipment can be raised to a higher level. Equally, voltage levels that are greater than the level required by the powered equipment can be converted to a lower level. It is therefore possible to produce an electrical voltage suitable for the powered equipment, independently of the voltage delivered by the thermocouple.

Converter circuits, particularly those that are implemented as semiconductor-based converter circuits, require a threshold voltage of around 0.3 V in order to initiate the process of voltage conversion. It is favorable here to provide this threshold voltage through a starting unit. The starting unit converts the voltage signal from the second thermoelectric element into a start signal that activates the converter circuit. Once the converter circuit has been activated, it can also operate with voltages below the threshold voltage. This method is particularly favorable if a voltage signal that provides the basis for the start signal is generated by a pyroelectric effect.

In order not to overload the process of voltage conversion or to stop it through excessive current consumption on the part of the powered equipment, it is favorable for the current supplied to the powered equipment to be limited according to the input voltage of the converter circuit. The input voltage to the converter circuit is therefore an electrical magnitude generated by the first thermoelectric element.

The heat source can adopt an operating state which may indeed involve a higher temperature than the surroundings, but where, however, the absolute temperature does not change. If, when the source of heat is in an operating state of this sort, the converter circuit is not operating, it is possible that the electrical voltage generated is not sufficient to overcome the threshold voltage of the converter circuit. Due to the temperature remaining constant, the pyroelectric process will also not generate any voltage that can be fed to the starting unit and thereby generate the start signal. In order to avoid this, a favorable embodiment of the method supplies a repeated signal to the starting unit, in response to which a start signal is generated. In order to generate the signal in a repeated or periodic manner, it is favorable to use a clock that draws the electrical energy necessary for its operation and the electrical energy for the start signal from an electrical storage facility.

In order to convert thermal energy into electrical energy, it is favorable to take the heat energy from a body that generates heat, for instance in the course of a working process. In order to exploit the heat from this body, or to convert it into electrical energy, it is favorable to couple it thermally to the elements provided for converting the thermal energy into electrical energy. The thermal coupling can be implemented in a variety of ways. One evident example is provided by thermal coupling using a thermally conductive paste applied between the body and the thermoelectric elements, coupling them thermally to the body. It is also possible to create the thermal coupling by means of what are known as heatpipes, using, for instance, a medium that transfers heat and a pipe in which that medium flows.

DETAILED DESCRIPTION OF DRAWINGS

DETAILED DESCRIPTION OF THE INVENTION

Figure 1:
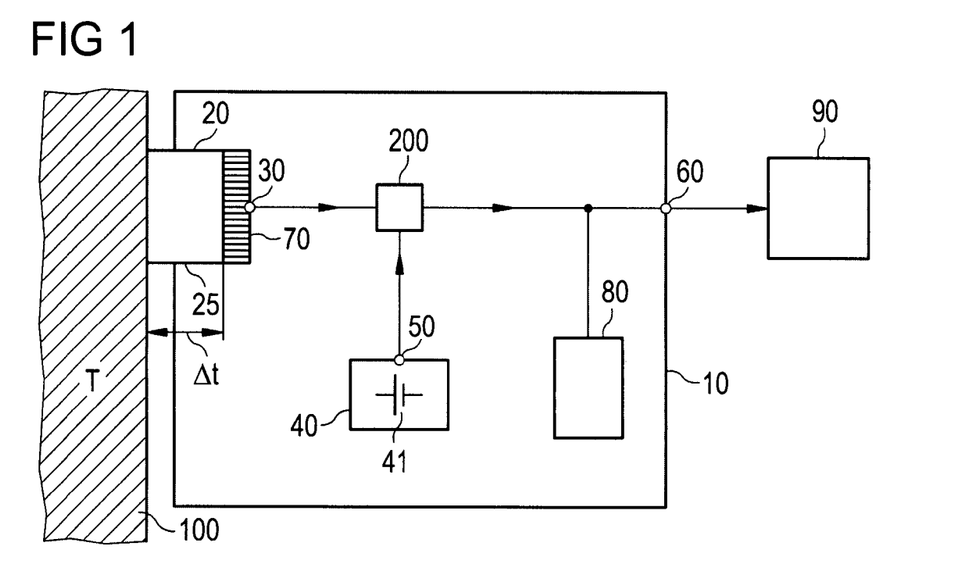
FIG. 1: An embodiment with one thermoelectric element.

FIG. 1 shows an embodiment in which a thermogenerator 10 has a first voltage source 20. The first voltage source 20 is implemented as a first thermoelectric element 25, and has a first voltage output 30. First thermoelectric element 25 can be a Seebeck Element available from EURECA Messtechnik GmbH as part no. TEG1-30-30-2.1/100.

The voltage output 30 is coupled via a decoupling circuit 200 to the voltage output 60 of the thermogenerator. A second electrical voltage source 40 is provided for those operating conditions in which the first voltage source 20, or the first thermoelectric element 25, is not delivering any voltage. In this case, the requirement for voltage, or the requirement for electrical energy, at voltage output 60 is covered by the second voltage source 40, which, for instance, comprises a first electrical storage element 41. For this purpose a second voltage output 50, which is assigned to the second electrical voltage source 40/41, is coupled through the decoupling circuit 200 to the voltage output 60 of the thermogenerator.

The decoupling circuit 200 prevents the two voltage sources 20/40 mutually feeding into each other, making the voltage at voltage output 60 dependent on the operating state of whichever voltage source is inactive at the time. The decoupling circuit 200 comprises, for instance, a semiconductor element such as a diode or a transistor that de-couples the two sources of voltage. Alternatively, the decoupling circuit comprises an electromechanical switching element that, depending on the operating states of the individual voltage sources, connects the first or second source of voltage to the output 60 of the thermogenerator.

The first electrical storage element 41 can be chosen to consist of either electrochemical storage elements or capacitative storage elements. In the case of electrochemical storage elements, either accumulators or primary-cell batteries may be used; either accumulators or primary-cell batteries may be more advantageous, depending on the intended application. Particularly in those cases in which the energy requirement of the powered equipment 90 is substantially to be supplied by the electrical energy supplied by the first thermoelectric element, it is possible that a primary-cell battery will be more economical as an electrical storage element than an accumulator, which involves higher initial costs.

As an alternative, a second electrical storage element 80 is provided that provides temporary storage for surplus energy supplied by the first thermoelectric element 25 but not immediately consumed by the powered equipment 90, and saves it for operating conditions under which the electrical energy supplied by the first thermoelectric element 25 is not sufficient for operation of the powered equipment. In order to transfer thermal energy from a body 100, the first thermoelectric element 25 is thermally coupled to this body 100. In this embodiment, this thermal coupling is provided through direct connection or mounting of the thermoelectric element 25, and thereby also the thermogenerator 10, to the body 100.

Figure 2:
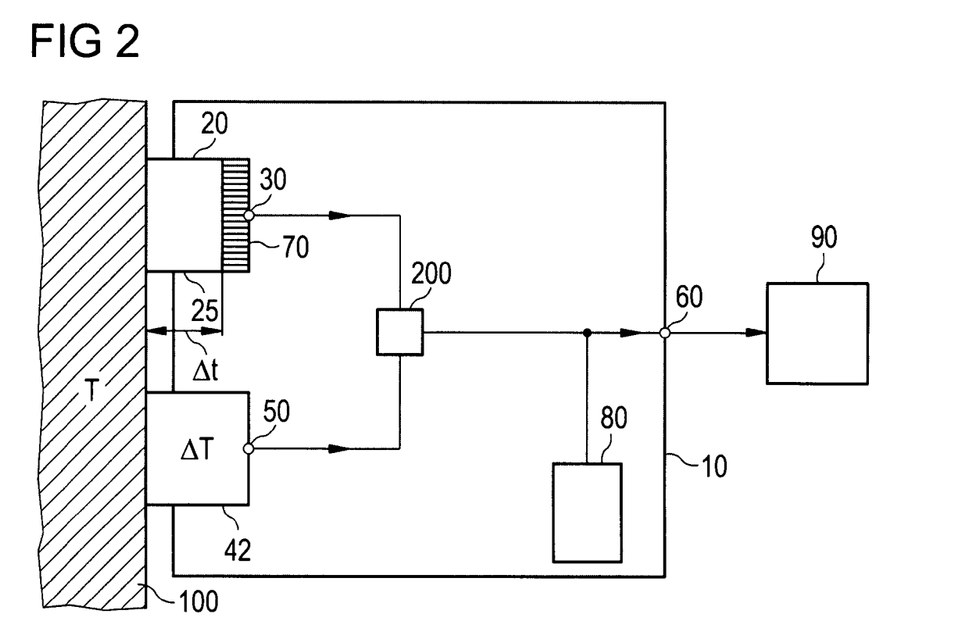
FIG. 2: An embodiment with two thermoelectric elements.

FIG. 2 shows an embodiment in which, in contrast to the embodiment shown in FIG. 1, the second voltage source is formed from a second thermoelectric element 42. Favorably this thermoelectric element 42 is implemented as a thermoelectric element that responds to a change in temperature, for instance a pyroelectric element. Pyroelectric elements generate electrical energy in response to a change in temperature, and this energy is made available at the second voltage output 50 of the second thermoelectric element 42. For this purpose, the second thermoelectric element 42 is thermally coupled to the body 100, as is the first thermoelectric element 25. For this purpose, the second thermoelectric element 42 is again directly located on the body 100, so that heat is directly transferred from the body 100 to the thermoelectric elements 25 and 42. Favorably the first thermoelectric element 25 consists of a Peltier element. The respective outputs, 30 and 50, of the thermoelectric elements are each coupled to the output 60 of the thermogenerator, to which the powered equipment 90 is connected. Power supply to the powered equipment 90 is thereby implemented for many operating conditions. For operating conditions in which neither the Peltier element supplies voltage in response to a temperature gradient Δt nor does the pyroelectric element supply voltage in response to a change in temperature ΔT, the second electrical storage element 80 is provided here, in order to cover this gap in the requirements by supplying temporarily stored energy to the output 60.

Figure 3:
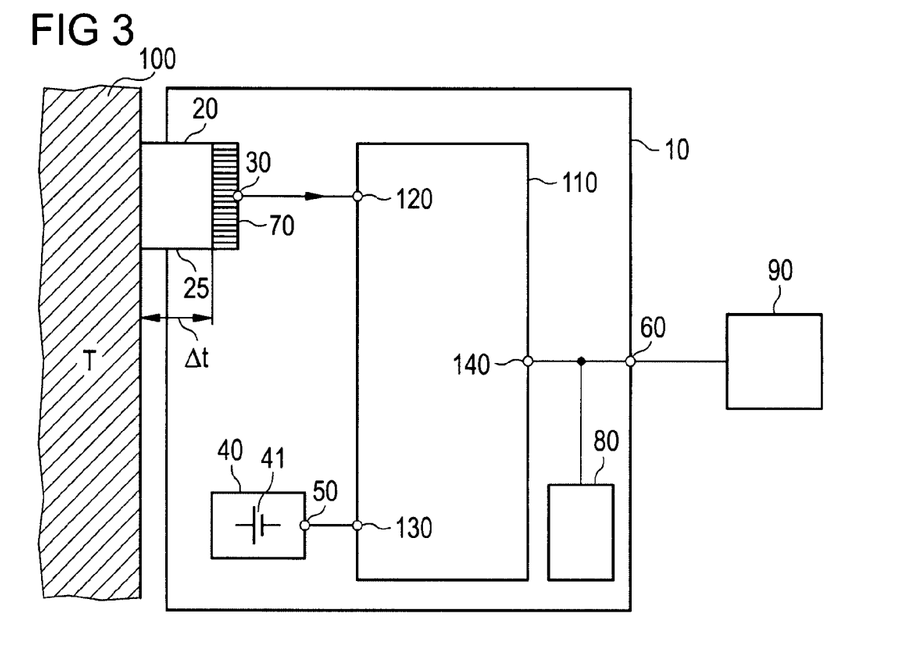
FIG. 3: An embodiment with one thermoelectric element and a voltage converter.

FIG. 3 shows an embodiment in which the thermogenerator comprises a voltage converter 110 that has a first voltage input 120 and a second voltage input 130. A suitable voltage converter 110 is available from ON Semiconductor as Part No. NCP 1400A. The first voltage input is connected to the first thermoelectric element 25, and this supplies electrical voltage to the first voltage input 120 through the first voltage output 30. The voltage converter 110 is provided in order to convert the voltage signal that is present at the voltage input 120 to a higher level, and to make this voltage available at the voltage converter output 140. The second electric voltage source 40 contains the first electric storage element 41, whose second voltage output 50 is connected to the second voltage input 130 of the voltage converter 110. If the temperature gradient Δt is too small to generate voltage at the first thermoelectric element 25, the electrical energy stored in the electric storage element 41 is supplied to the second voltage input 130 of the voltage converter 110. The voltage converter output 140 is connected to the second electric storage element 80, in order temporarily to store surplus energy that is not required by the powered equipment 90. In this embodiment again, the first thermoelectric element 25 is connected through thermal coupling to the body 100, so that heat energy from the body 100 can be transferred to the thermoelement. Again in this embodiment a heat sink 70 is located on the thermoelement, so that the temperature gradient across the first thermoelectric element 25, that is the Peltier element, can be increased.

Figure 4:
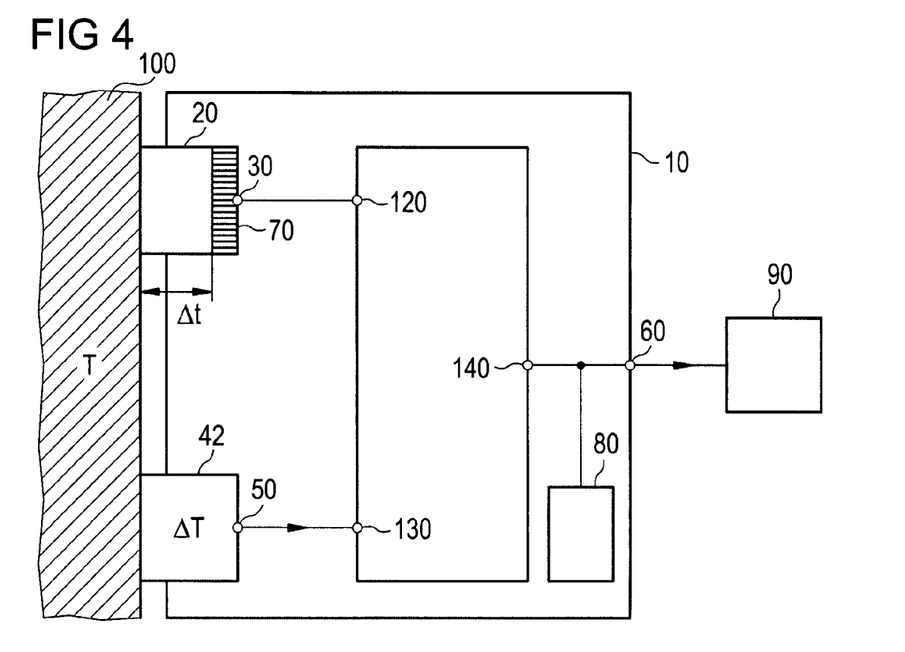
FIG. 4: An embodiment with two thermoelectric elements and a voltage converter.

FIG. 4 shows a favorable embodiment in which, in contrast to the embodiment shown in FIG. 3, the second voltage source is formed from a second thermoelectric element 42. This second thermoelectric element 42 is a thermoelectric element that is responsive to changes in temperature, such as a pyroelectric element.

An advantage of this form of embodiment is that electrical voltage or electrical energy can be converted under a variety of operating conditions of the body 100. The voltage converter 110 uses the voltage at the two voltage inputs to make the voltage level required by the powered equipment 90 available at the output or at the voltage converter output 140.

Figure 5:
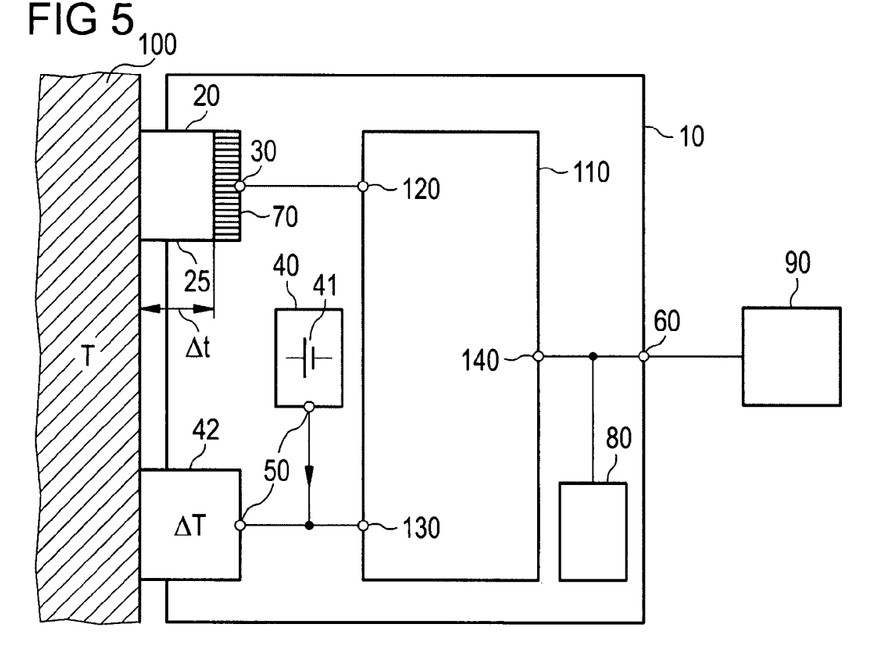
FIG. 5: An embodiment with two thermoelectric elements and a voltage converter

FIG. 5 shows a favorable embodiment in which the second voltage source is implemented as a combination or parallel connection of the first electrical storage element 41 and the second thermoelectric element 42. This means that the first electric storage element 41, which might for instance consist of an electrochemical storage element such as a primary-cell battery or accumulator, makes voltage for operation of the voltage converter 110 available at the input of the voltage converter 130 when the operating conditions are such that the temperature of the body 100 is constant.

Figure 6:
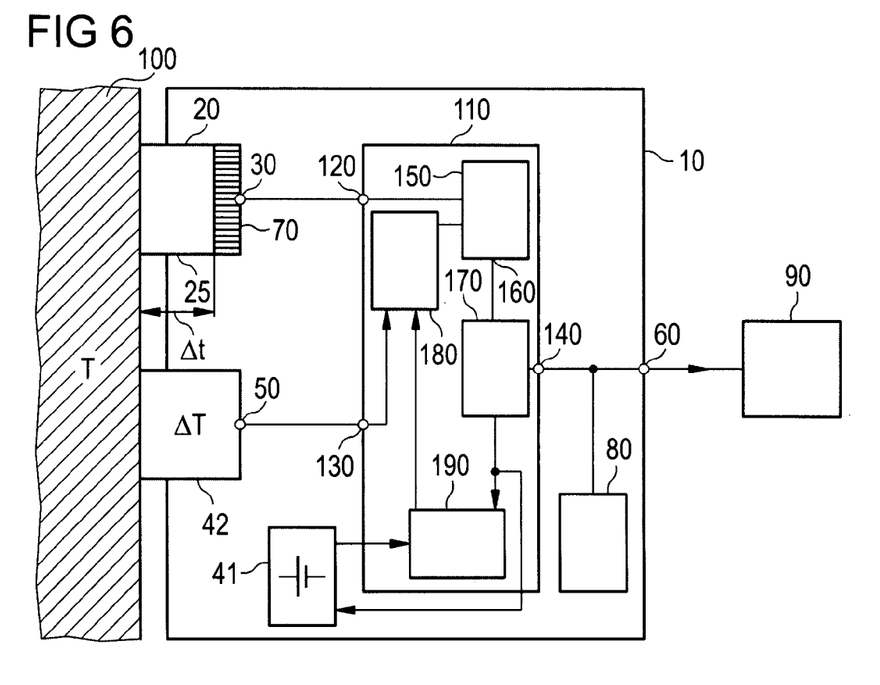
FIG. 6: An embodiment with two thermoelectric elements and a voltage converter with a starting unit.

FIG. 6 shows a particularly favorable embodiment in which the voltage converter 110 includes a converter circuit 150 that is joined to the first voltage input 120. The converter circuit 150 converts the voltage level at the voltage input 120 to a level higher than this, and makes it available at the output 160 of the converter circuit. The output of the converter circuit 160 is connected through a current limiting circuit 170 to the output 140 of the voltage converter, and through that to the output 60 of the thermogenerator. The current limiting circuit 170 limits the magnitude of the current delivered depending on the voltage signal or current magnitude present at the first voltage input 120.

In this way the current limiting circuit 170 prevents an overload of the converter circuit 150 that would result in stopping the conversion process in the converter circuit 150.

The converter circuit 150 is favorably implemented as a semiconductor converter circuit. This means that in order to start operation of the converter circuit 150, a threshold voltage in the converter circuit must at least be overcome, and this is done by a start signal provided by the converter circuit.

The embodiment in FIG. 6 has two ways of generating a start signal. In one variant, the pyroelectric element 42 generates a voltage signal that in most cases exceeds the threshold voltage as a result of a change in temperature. This start signal is passed to the starting unit 180 through the second voltage input 130, which is designed for high-impedance; a start signal is generated from this voltage signal, and is passed to the converter circuit 150. In addition, the starting unit prevents destruction of the converter circuit as a result of excessive voltage, as excess voltage is kept away from the converter circuit 150 by means of the starting unit. The process by which the conversion of thermal energy into electrical energy starts up can therefore be described as follows. The body 100 warms up slowly, so that over the course of time a spatial temperature gradient is present at the Peltier element 25. While the temperature is changing, the pyroelectric element generates an electrical voltage at its voltage output 50, and this is passed through the second voltage input 130 to the starting unit 180. The starting unit 180 generates a start signal out of this voltage signal, and passes it to the converter circuit 150. The converter circuit obtains operating energy from the start signal, as a result of which it begins to start up the voltage conversion process, and converts the voltage signal At produced by the Peltier element in response to the temperature gradient and present at the first voltage input 120 of the voltage converter. In this embodiment the voltage output has a low impedance. The voltage signal from the Peltier element, which is usually of a low level, is converted to a higher level and is made available to the powered equipment 90 through the current limiting circuit 170 at the third voltage output 60 which is the voltage output of the thermogenerator.

If the process of voltage conversion is stopped, for whatever reason, and if there is a spatial temperature gradient Δt the Peltier element 25, then it can happen that the voltage at the first voltage input to the voltage converter 110 is not sufficient to overcome the threshold voltage in the converter circuit. A clock 190 is provided for this operating state; it obtains the electrical energy necessary for its operation from the storage element 41 or from the storage element 80. The storage element 41 or the storage element 80, implemented as an electrochemical or capacitative storage element, obtains its energy also through the current limiting circuit 170 from the converter circuit 150. In an alternative embodiment, in which a primary-cell battery is provided as the storage element 41, electrical energy is not supplied to the storage element. The storage element supplies the energy required for operation of the clock as well as the energy required to generate the start signal. The clock 190 sends a signal to the starting unit 180 repeatedly, or at periodic intervals. As a reaction to this signal, the starting unit 180 generates a start signal, and supplies it to the converter circuit 150. This means that for as long as the converter does not supply any voltage, the clock 190 periodically or repeatedly generates a start signal and supplies it to the converter circuit 150, and this can initiate the voltage conversion process in response to the start signal.

Figure 7:
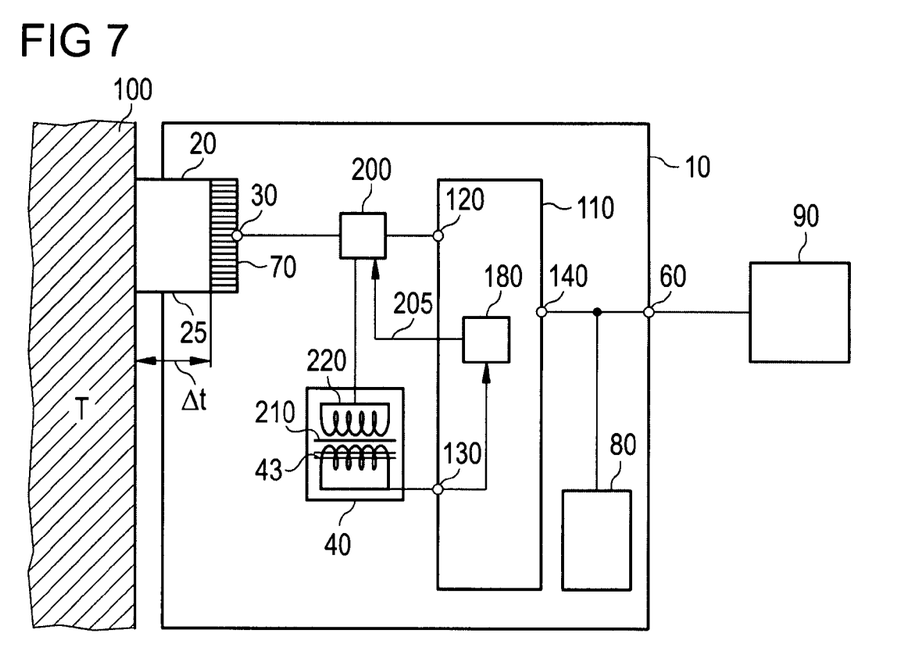
FIG. 7: An embodiment with a Wiegand or pulse-wire element as the second voltage source.

FIG. 7 shows an embodiment of the invention in which a Wiegand or a pulse-wire element 43 forms the second voltage source. The Wiegand or pulse-wire element is connected through the decoupling circuit 200 to the first voltage source, the first thermoelectric element 25, in such a way that the voltage generated by the first voltage source is supplied to a coil 220. The coil 220 develops a magnetic field on the basis of the voltage generated by the thermoelectric element 25. As the voltage generated by the first thermoelectric element 25 rises, so also does the voltage at the coil 220, and also therefore the flux density of the magnetic field created by the coil 220. A soft iron core 210 optimally couples this magnetic field to the Wiegand or pulse-wire element 43. When a prespecified value of the magnetic field is reached, the magnetization of the Wiegand or pulse-wire element 43 spontaneously inverts, creating an electric voltage signal of several volts within the Wiegand or pulse-wire element 43. This voltage is fed to the voltage converter 110 at input 130. This voltage pulse receives further processing in voltage converter 110. The further processing of the voltage pulse generated by the Wiegand or pulse-wire element 43 involves, for instance, powering the starting unit 180 and thereby generating a start signal that is passed to the voltage converter 110. In the same way, as shown in the embodiment described in FIG. 6, when the start signal enters the voltage converter 110 it overcomes the threshold voltage of the semiconductor-based voltage converter 110. Other aspects of the operation of the voltage converter 110 also correspond to the embodiment described in FIG. 6.

In the case of the voltage converter 110 in the embodiment shown in FIG. 7, there is an optional difference in that a control pulse is transmitted to the decoupling circuit in parallel with the start signal, and the effect of this on the decoupling circuit is that the Wiegand or pulse-wire element 43 is disconnected from the first thermoelectric element. This is particularly favorable because then the coil 220 is in an operating condition in which the voltage converter circuit is working, no additional electrical energy is drawn from the first thermoelectric element 25, and therefore all the electrical energy generated by the first thermoelectric element 25 is passed to the voltage conversion circuit in the voltage converter 110.

Figure 8:
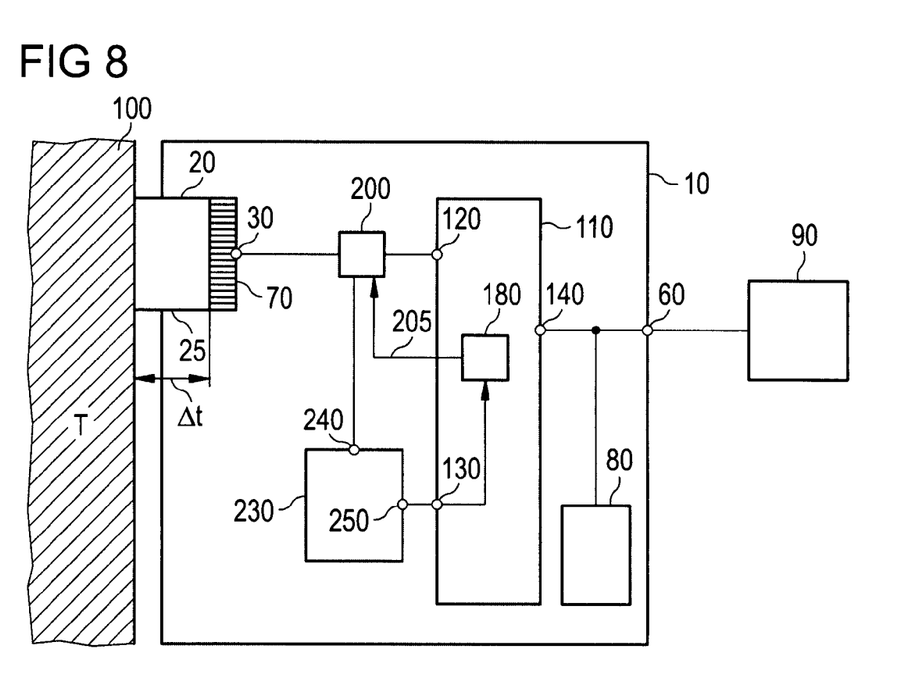
FIG. 8: An embodiment with a semiconductor voltage multiplier as the second voltage source.

FIG. 8 shows an embodiment of the invention in which a semiconductor voltage multiplier 230 forms the second voltage source. The semiconductor voltage multiplier 230 is connected through the decoupling circuit 200 to the first voltage source, the first thermoelectric element 25, in such a way that the voltage generated by the first voltage source is supplied to a circuit input 240 of the semiconductor voltage multiplier. The semiconductor voltage multiplier 230 is an oscillator that begins to oscillate even at very low voltages, and provides a voltage, magnified from the input voltage, at an output 250. This voltage is fed to the voltage converter 110 at input 130. This voltage receives further processing in voltage converter 110. The further processing of the voltage generated by the semiconductor voltage multiplier 230 involves, for instance, powering the starting unit 180 and thereby generating a start signal that is passed to the voltage converter circuit 180. In the same way, as shown in the embodiment described in FIG. 6, when the start signal enters the voltage converter circuit 180 it overcomes the threshold voltage of the semiconductor-based voltage converter circuit 180. Other aspects of the operation of the voltage converter 110 also correspond to the embodiment described in FIG. 6.

In the embodiment in FIG. 8 a control pulse 205 to the decoupling circuit 200 can be seen, for instance in parallel to the start signal. The effect of the control pulse on the decoupling circuit is for the semiconductor voltage multiplier 230 to be decoupled from the first thermoelectric element. This is particularly favorable because then the semiconductor voltage multiplier 230 is in an operating condition in which the voltage converter circuit is working, no additional electrical energy is drawn from the first thermoelectric element 25, and therefore all the electrical energy generated by the first thermoelectric element 25 is passed to the voltage conversion circuit in the voltage converter circuit 180.

Figure 9:
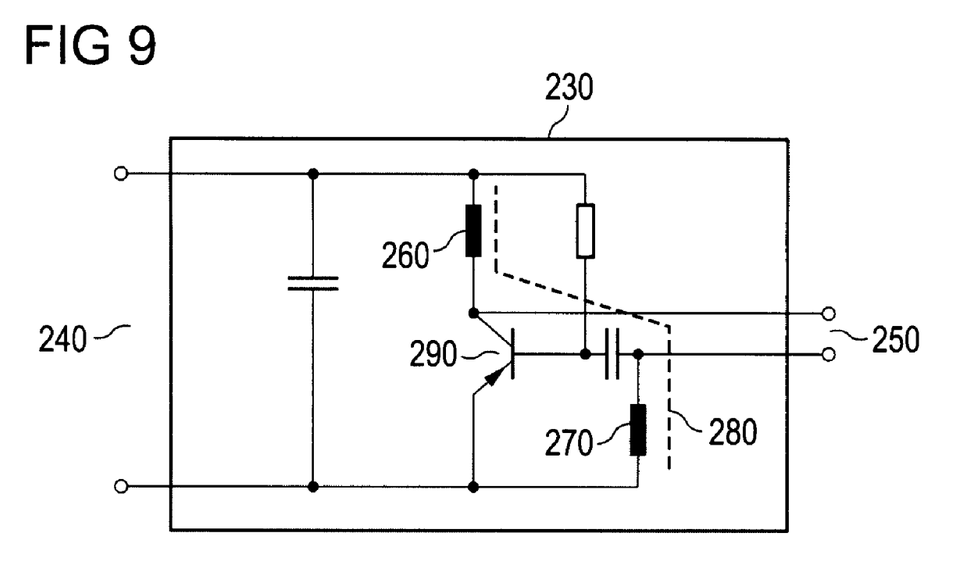
FIG. 9: An embodiment of a semiconductor voltage multiplier.

FIG. 9 shows an example of the semiconductor voltage multiplier 230. It incorporates a transformer, having a primary winding 260 and a secondary winding 270. The primary and secondary windings are coupled by means of a common transformer core 280. A transistor 290 acts as the switching element. In order to keep the threshold voltage of the circuit low, a germanium transistor is particularly suitable. If a voltage is applied to input 240 that is low but which nevertheless exceeds the threshold voltage of approx. 60 mV-100 mV, the transistor is conductive, so that a magnetic field develops in the primary winding 260. As a result of the coupling through the transformer core 280, a magnetic field also develops through the secondary winding, inducing a voltage in the secondary winding 270. As a result of this voltage, which is present at the base of the transistor 290, transistor 290 changes its state, stopping the current flowing between the collector and emitter of the transistor 290. This causes the magnetic field in the primary winding to collapse, generating a voltage pulse of about 5 V between the collector and base of transistor 290. As a consequence, the transistor is once again able to pass current between collector and emitter, and the process begins again.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. A method for generating a supply voltage by harvesting electrical energy from ambient non-electrical thermal energy, comprising the steps of:
    providing the electrical energy with a first voltage;
    converting the first voltage by a first method into an auxiliary voltage which is higher than the first voltage, the first voltage being decoupled from the auxiliary voltage;
    converting the first voltage into the supply voltage, which is higher than the first voltage, by a second method under use of the auxiliary voltage; and
    deactivating the converting of the first voltage to the auxiliary voltage when the second method is activated.

2. The method according to claim 1, wherein the auxiliary voltage is used for initiating the second method.

3. The method according to claim 2, wherein the first method uses converting the first voltage into an oscillating voltage under use of an oscillator.

4. The method according to claim 3, wherein the converting of the first voltage into the auxiliary voltage comprises transforming the oscillating voltage.

5. The method according to claim 4, wherein the converting of the voltage uses an inductive effect.

6. The method according to claim 1, wherein the thermal energy is harvested into electrical energy by the use of the Seebeck effect.

7. The method according to claim 1, further comprising:
    decoupling the first voltage from the auxiliary voltage by a decoupling circuit electrically connected between the first voltage and the auxiliary voltage; and
    deactivating the converting of the first voltage to the auxiliary voltage by said decoupling circuit when the second method is activated.

\* \* \* \* \*